(12) United States Patent
Richter et al.

(10) Patent No.: US 7,678,690 B2
(45) Date of Patent: Mar. 16, 2010

(54) SEMICONDUCTOR DEVICE COMPRISING A CONTACT STRUCTURE WITH INCREASED ETCH SELECTIVITY

(75) Inventors: Ralf Richter, Dresden (DE); Carsten Peters, Dresden (DE); Heike Salz, Radebeul (DE); Matthias Schaller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 523 days.

(21) Appl. No.: 11/534,285

(22) Filed: Sep. 22, 2006

(65) Prior Publication Data

US 2007/0152343 A1 Jul. 5, 2007

(30) Foreign Application Priority Data

Dec. 30, 2005 (DE) .................. 10 2005 063 092

(51) Int. Cl.
*H01L 21/4763* (2006.01)

(52) U.S. Cl. ................ 438/634; 438/637; 257/E21.577

(58) Field of Classification Search .......... 257/E21.577, 257/E21.579, E21.585, E21.59, E21.658, 257/382, 383, E21.507, E21.432, 597, 197, 257/585; 438/233, 634, 637, 639, 672, 675, 438/700, 740, 445

See application file for complete search history.

(56) References Cited

U.S. PATENT DOCUMENTS

| 4,777,147 | A |  | 10/1988 | Scott et al. ................... 437/57 |
|---|---|---|---|---|
| 4,844,776 | A |  | 7/1989 | Lee et al. ..................... 156/653 |
| 5,112,765 | A |  | 5/1992 | Cederbaum et al. ........... 437/41 |
| 5,795,800 | A |  | 8/1998 | Chan et al. ................... 438/149 |
| 5,940,735 | A |  | 8/1999 | Mehta et al. ................. 438/783 |
| 5,990,524 | A | * | 11/1999 | En et al. ...................... 257/382 |
| 6,124,192 | A |  | 9/2000 | Jeng et al. ................... 438/597 |
| 6,204,161 | B1 |  | 3/2001 | Chung et al. ................. 438/612 |
| 6,274,409 | B1 |  | 8/2001 | Choi .......................... 438/128 |
| 6,288,425 | B1 | * | 9/2001 | Adan .......................... 257/347 |
| 6,426,263 | B1 |  | 7/2002 | Chittipeddi ................. 438/281 |
| 6,483,153 | B1 | * | 11/2002 | Hui et al. ..................... 257/382 |
| 2004/0219729 | A1 |  | 11/2004 | Kang .......................... 438/200 |
| 2006/0189064 | A1 | * | 8/2006 | Shim et al. .................. 438/210 |

FOREIGN PATENT DOCUMENTS

WO    WO 01/99183 A2    12/2001

\* cited by examiner

*Primary Examiner*—Davienne Monbleau
*Assistant Examiner*—Shweta Mulcare
(74) *Attorney, Agent, or Firm*—Williams, Morgan & Amerson, P.C.

(57) ABSTRACT

By providing additional etch stop layers and/or etch protection layers, a corresponding etch process for forming contact openings for directly connecting polysilicon lines and active areas may be controlled in a highly reliable manner. Consequently, conductive line erosion and/or penetration into extension regions may be significantly reduced, thereby improving the reliability and performance of corresponding semiconductor devices.

12 Claims, 12 Drawing Sheets

SEMICONDUCTOR DEVICE COMPRISING A CONTACT STRUCTURE WITH INCREASED ETCH SELECTIVITY

BACKGROUND OF THE INVENTION

1. Field of the Invention

The present invention relates to the field of semiconductor manufacturing, and, more particularly, to the formation of an interconnect structure having a contact plug for directly connecting a gate line with a drain/source region of a transistor.

2. Description of the Related Art

Semiconductor devices, such as advanced integrated circuits, typically contain a large number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements generally may not be established within the same level on which the circuit elements are manufactured, but require one or more additional "wiring" layers, which are also referred to as metallization layers. These metallization layers generally include metal-containing lines, providing the inner-level electrical connection, and also include a plurality inter-level connections, which are also referred to as "vias," that are filled with an appropriate metal and provide the electrical connection between two neighboring stacked metallization layers.

To establish the connection of the circuit elements with the metallization layers, an appropriate vertical contact structure is provided that connects to a respective contact region of a circuit element, such as a gate electrode and the drain/source regions of transistors, and to a respective metal line in the first metallization layer. The contact plugs and regions of the contact structure are formed in an interlayer dielectric material that encloses and passivates the circuit elements. In some circuit configurations, a connection of individual areas of a circuit element with other individual areas of the same or other circuit elements, such as a connection from a gate electrode or a polysilicon line to an active semiconductor region, such as a drain/source region, may be established by means of the contact structure on the basis of respective contact regions. One example in this respect is the wiring scheme of certain memory devices in which respective contact trenches, frequently called CAREC contacts, connect the gate electrode or polysilicon lines with a drain/source region.

During the formation of respective contact regions directly connecting individual contact regions of circuit elements, however, a plurality of issues may arise, in particular for highly advanced semiconductor devices having critical feature sizes of 100 nm and even less. With reference to FIGS. 1a-1d, a typical conventional process flow for forming respective contact regions for directly connecting polysilicon lines or gate electrodes with respective active semiconductor regions, i.e., drain/source regions, will be described in more detail in order to more clearly demonstrate the problems involved therein.

FIG. 1a schematically shows a semiconductor device 100, which may represent any appropriate circuit, in which a direct contact region, a so-called CAREC, may be formed to connect adjacent circuit regions. The semiconductor device 100 may comprise a substrate 101, which may represent any appropriate substrate, such as a bulk silicon substrate, a silicon-on-insulator (SOI) substrate and the like. The substrate 101 has formed thereon a substantially crystalline semiconductor layer 102 on and in which respective circuit elements are formed, one of which is indicated as element 120. A trench isolation 103 may be formed within the semiconductor layer 102 to define an active semiconductor region 111, which is to be understood as a doped semiconductor region, in which at least a portion is configured in substantially the same way as a drain or source region of a field effect transistor of the device 100. Consequently, the active region 111 may comprise implanted areas 107, 107e, which may conveniently be referred to as drain/source regions 107 with respective extension regions 107e. Moreover, the device 100 may comprise a polysilicon line 104, which may be formed above the active region 111 and which may be separated therefrom by an insulation layer 105, wherein the polysilicon line 104 may be substantially formed according to design criteria as are also used for the formation of gate electrode structures in the device. On sidewalls of the polysilicon line 104, respective sidewall spacers 106 may be formed which are typically comprised of silicon nitride. Respective metal silicide regions 108 may be formed on top of the polysilicon line 104 and in the drain/source region 107 and a contact etch stop layer 109, typically comprised of silicon nitride, may be formed on the active region 111 and the polysilicon line 104 including the sidewall spacers 106. Finally, an interlayer dielectric material 110 may be formed above the circuit element 120 represented by the polysilicon line 104 and the active region 111 so as to enclose and passivate the circuit element 120.

A typical process flow for forming the semiconductor device 100 as shown in FIG. 1a may comprise the following processes. The insulation layer 105 and the polysilicon line 104 may be formed on the basis of well-established oxidation, deposition, photolithography and etch techniques, wherein lateral dimensions of the polysilicon line 104 may be formed in accordance with device requirements, wherein, in sophisticated devices, the lateral dimension may be approximately 100 nm and even less. Thereafter, the sidewall spacers 106 may be formed by well-established deposition and anisotropic etch techniques, wherein prior to and after the formation of the sidewall spacer 106, which may be comprised of a plurality of spacer elements, appropriate implantation processes may be performed in order to form the source/drain region 107 including the extension region 107e. Next, the metal silicide regions 108 may be formed, for instance, by depositing an appropriate refractory metal and initiating a silicidation process on the basis of an appropriate heat treatment. After the removal of any excess material, the contact etch stop layer 109 may be formed on the basis of well-established plasma enhanced chemical vapor deposition (PECVD) techniques followed by the deposition of the interlayer dielectric material 110, which is typically comprised of silicon dioxide. After any planarization processes, such as chemical mechanical polishing (CMP) and the like, for providing a substantially planar surface of the interlayer dielectric material 110, an appropriate photolithography process may be performed on the basis of a corresponding photolithography mask in order to form a resist mask (not shown) having respective openings corresponding to respective contact openings to be formed above the polysilicon line 104 and the drain/source region 107 to establish a direct electric connection therebetween. Based on a corresponding resist mask, an anisotropic etch process may be performed, which may then be stopped in and on the contact etch stop layer 109 due to the high etch selectivity of the corresponding etch recipe for etching through the silicon dioxide material of the layer 110. Subsequently, a further etch step may be performed to open the contact etch stop layer 109 in order to contact the polysilicon line 104, i.e., the respective metal silicide region 108 formed thereon, and the drain/source region 107, i.e., the corresponding metal silicide region 108 formed therein. During the respective etch process, the sidewall spacers 106 at least at the side of the drain/source region 107 may also be completely removed, since the contact etch stop layer 109 and the spacers 106 are comprised of the same material and a certain degree of over-etch is required to reliably expose the respective metal silicide regions 108. Consequently, during this over-etch time, the etch front may also attack, after having removed the sidewall spacer 106, the extension region 107e so that the etch front may penetrate the extension region 107e to a certain degree thereby possibly creating a short to the remaining active region 111 or at least providing a significant risk of increased leakage currents of the resulting electric connection.

FIG. 1b schematically shows the semiconductor device 100 after the completion of the above-described process sequence. Moreover, the semiconductor device 100 comprises a contact region 112, which may be filled with a conductive material, such as tungsten, wherein, at sidewall portions 112S and bottom portions 112B, a conductive barrier material, such as titanium and the like, may be provided. Since the contact region 112 is connected to the respective metal silicide regions 108 of the polysilicon line 104 and the drain/source region 107, a direct electrical connection between these two device areas is established. Moreover, as previously indicated, the etch process for forming a respective contact opening in the interlayer dielectric material 110 and the contact etch stop layer 109 may have created a recess 113 in the extension region 107e, which may even extend into the active region 111 below the extension region, which may be referred to as a well region, thereby possibly creating a short or at least a current path for increased leakage currents. Subsequently, the contact region 112 may be formed on the basis of well-established recipes, comprising, for instance, the deposition of the barrier layer 114 in accordance with well-established chemical vapor deposition (CVD), physical vapor deposition (PVD) techniques, followed by any appropriate fill technique, such as CVD on the basis of appropriate precursor materials. After removing any excess material of the barrier material and the conductive material comprising the contact region 112, a further passivation layer may be deposited.

As a result, the conventional technique may lead to increased leakage currents or even short circuits between portions 113 of the active region 111 that are inversely doped with respect to the drain/source regions 107 and the extension regions 107e, thereby significantly negatively affecting the performance of the device 100.

FIG. 1c schematically shows the semiconductor device 100 according to a similar configuration as shown in FIG. 1a, in which the circuit element 120 may represent a field effect transistor having substantially the same components as previously described with reference to FIG. 1a. Moreover, a resist mask 115 is formed above the interlayer dielectric material 110, wherein an opening 115A is formed in the resist mask 115 that substantially corresponds to the dimensions of a respective contact opening to be formed in the interlayer dielectric material 110 for providing a direct electric contact from the gate electrode 104 to the respective drain/source regions 107. Moreover, the device 100 is subjected to an anisotropic etch process 116 for etching through the interlayer dielectric material 110, wherein similarly, as is previously described, the etch process 116 may, in a first step, comprise a high etch selectivity with respect to the materials of the layers 110 and the contact etch stop layer 109. After opening the material of the layer 110, a further etch process may be performed to open the contact etch stop layer 109 and reliably remove any material thereof to connect to the respective metal silicide regions 108. During the significant over-etch time of this etch process, sidewalls of the gate electrode 104 are increasingly exposed to the respective etch ambient, which may result in a significant material erosion of the gate electrode 104.

FIG. 1d schematically illustrates the semiconductor device 100 after the completion of the above-described etch process. Consequently, the gate electrode 104 may have suffered severe etch damage, which may result in reduced device reliability and integrity. For example, the mechanical stability of the gate electrode 104 may be significantly reduced, which may lead to an increased defect rate in subsequent manufacturing processes, such as resist removal, cleaning processes prior to the deposition of a barrier material and the subsequent filling in of the conductive contact material. Consequently, the conventional contact technology for providing direct contacts between polysilicon lines and active semiconductor regions may additionally suffer from reduced mechanical integrity and increased defect rate.

In view of the situation described above, there exists a need for an enhanced technique that may enable the formation of contact regions for directly connecting contact regions of circuit elements within the contact structure while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of reliable contact structures including direct connections between adjacent contact regions of circuit elements, such as CAREC contacts, wherein an increased reliability with respect to the mechanical integrity as well as in view of short circuits and leakage currents may be achieved. For this purpose, additional etch stop layers and/or etch protection layers may be formed to increase the etch selectivity during the etch process for forming respective contact openings within the interlayer dielectric material and the contact etch stop layer. The respective etch stop layer and/or etch protection layer may have a high etch selectivity with respect to the contact etch stop layer and respective sidewall spacers, thereby reducing any penetration of sensitive device areas, such as semiconductor areas or exposed sidewall portions of polysilicon lines, resulting in a reduced risk for increased leakage currents or short circuits while nevertheless a high degree of compatibility with conventional process techniques may be maintained.

According to one illustrative embodiment of the present invention, a method comprises forming an etch stop layer above a circuit element having a conductive line and an active semiconductor region, wherein the etch stop layer covers an area that substantially corresponds to a contact opening to be formed to connect the conductive line and the active semiconductor region. The method further comprises forming an interlayer dielectric material above the circuit elements and the etch stop layer and forming the contact opening in the interlayer dielectric material by an etch process using the etch stop layer as an etch stop. Finally, the contact opening is filled with a conductive material.

According to another illustrative embodiment of the present invention, a method comprises forming a conductive line above a substrate and forming an etch protection layer on sidewalls of the conductive line. Moreover, the conductive line is embedded in an interlayer dielectric material and a contact opening is formed in the interlayer dielectric material for contacting to the conductive line and the semiconductor region, wherein the etch protection layer protects the sidewalls of the conductive line during the etch process. Finally, the contact opening is filled with a conductive material to electrically connect the conductive line with the exposed semiconductor region.

According to yet another illustrative embodiment of the present invention, a semiconductor device comprises a conductive line and an active semiconductor region adjacent to the conductive line. The device further comprises an interlayer dielectric layer formed around the conductive line and the active semiconductor region and a contact region formed in the interlayer dielectric layer, wherein the contact region is filled with a conductive material to electrically connect the conductive line and the active semiconductor region. Moreover, the device comprises an etch stop layer formed within at least a portion of the contact region, wherein the etch stop layer is located between the conductive material and the active semiconductor region. The etch stop layer is comprised of a material having a high etch selectivity with respect to a contact etch stop layer formed between the interlayer dielectric layer and the etch stop layer.

BRIEF DESCRIPTION OF THE DRAWINGS

The invention may be understood by reference to the following description taken in conjunction with the accompanying drawings, in which like reference numerals identify like elements, and in which.

Figure 1A:
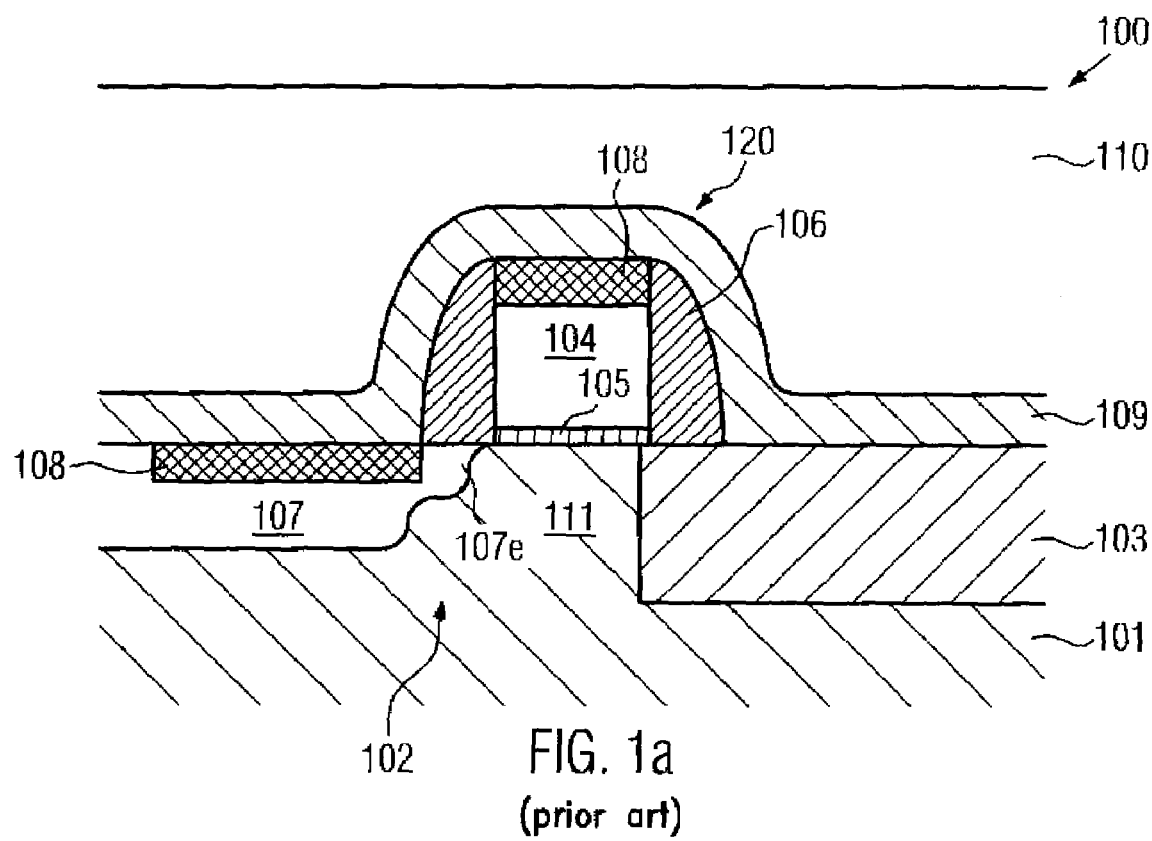
FIGS. 1a-1d schematically show cross-sectional views of a conventional semiconductor device during the formation of a contact region for directly connecting a polysilicon line and a drain/source region during various manufacturing stages in accordance with conventional techniques, resulting in an increased risk for leakage currents or short circuits and/or polysilicon line erosion.
Figure 1B:
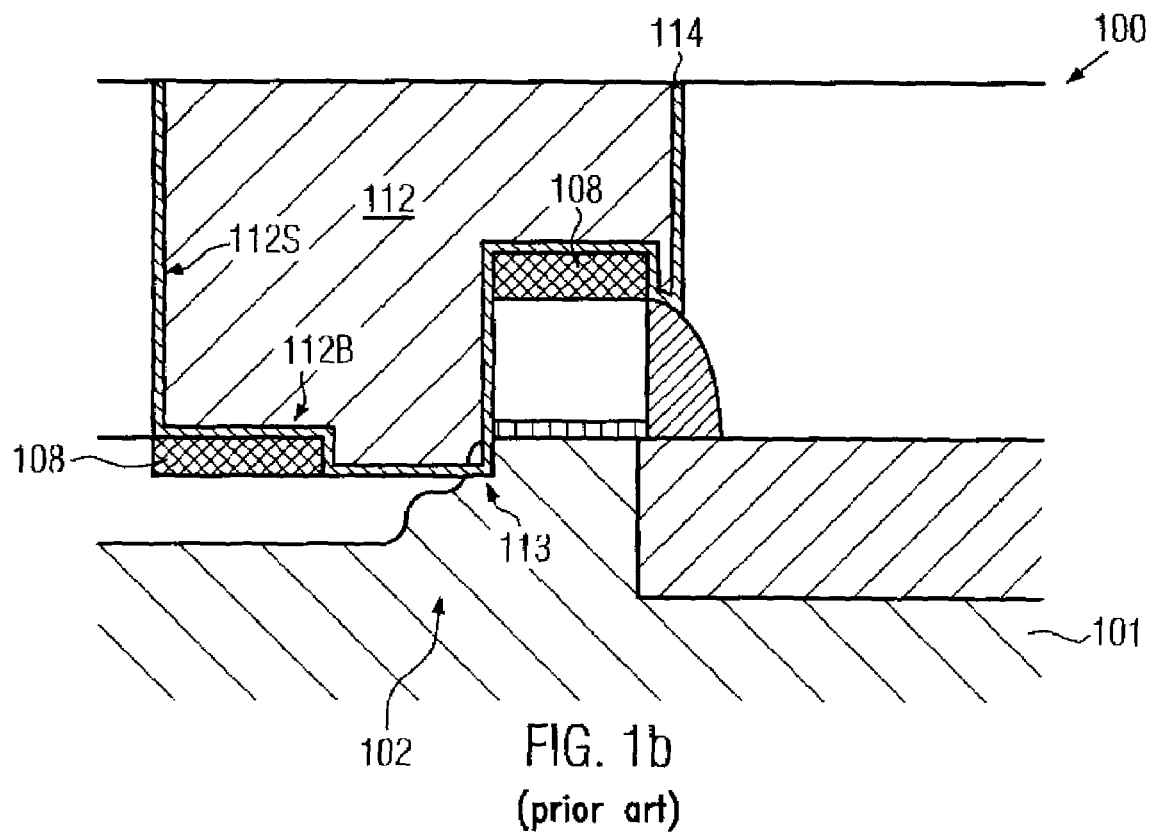

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for the formation of contact regions, i.e., metal-filled regions within an interlayer dielectric layer for electrically connecting respective contact regions of circuit elements, such as field effect transistors, polylines, active regions and the like, in a direct fashion, i.e., without an electrical contact via the first metallization layer, wherein an increased reliability during the formation of a respective contact opening may be achieved due to the provision of an additional etch stop layer and/or etch protection layer to reduce an adverse etch attack of exposed silicon areas during the contact opening etch. For this purpose, the additional etch stop layer may be positioned at a variety of locations, that is, immediately in contact with the respective silicon area to be protected, above the circuit elements but below the respective contact etch stop layer, between the contact etch stop layer and the interlayer dielectric material, above the contact etch stop layer, or corresponding etch stop layers or etch protection layers may be provided in combination at any desired combinations of the above-specified locations. That is, multiple etch stop layers may be provided depending on process and device requirements. Moreover, in some illustrative embodiments, the etch stop layer may be provided in the form of a conductive barrier layer that may not have to be removed prior to the filling in of conductive material, while, in other illustrative embodiments, the etch stop layer may be removed in a highly controlled etch process without unduly enhancing the risk for undue etch damage during this removal process. In still other illustrative embodiments, the etch stop layer and/or etch protection layer may be maintained during the etch process, except for minor etch damage, and may further be maintained during the subsequent formation of a barrier layer. It should be appreciated that, in the following description of further illustrative embodiments of the present invention, it may be referred to as a gate electrode, which is to be understood as a synonym for a conductive feature, since typically any polysilicon lines or other conductive features formed over active areas or insulating areas, such as trench isolations, may be formed in accordance with design criteria as are also applied for respective gate electrodes. Similarly, in the following description, it may be referred to as a drain/source region, which may be formed within an active semiconductor region and which may not necessarily have the function of a drain and source region, but may be formed in accordance with respective design criteria, since typically the implantation sequence is performed commonly for drain and source regions as well as any other doped regions that may not necessarily be part of an actual transistor device. Thus, the terms drain/source regions and active semiconductor region may be used as synonyms. Furthermore, the present invention is highly advantageous in the context of highly sophisticated integrated circuits having transistor elements with a gate length of 100 nm and even less, since such elements have extremely tight process margins with respect to junction depth and the like and may significantly increase the risk for leakage currents or short circuits, as is previously explained. It should be appreciated, however, that the present invention may also be applied to less critical applications and the invention should not be construed as being restricted to any specific device dimensions, unless such restrictions are explicitly set forth in the following detailed description as well as in the appended claims.

Figure 2A:
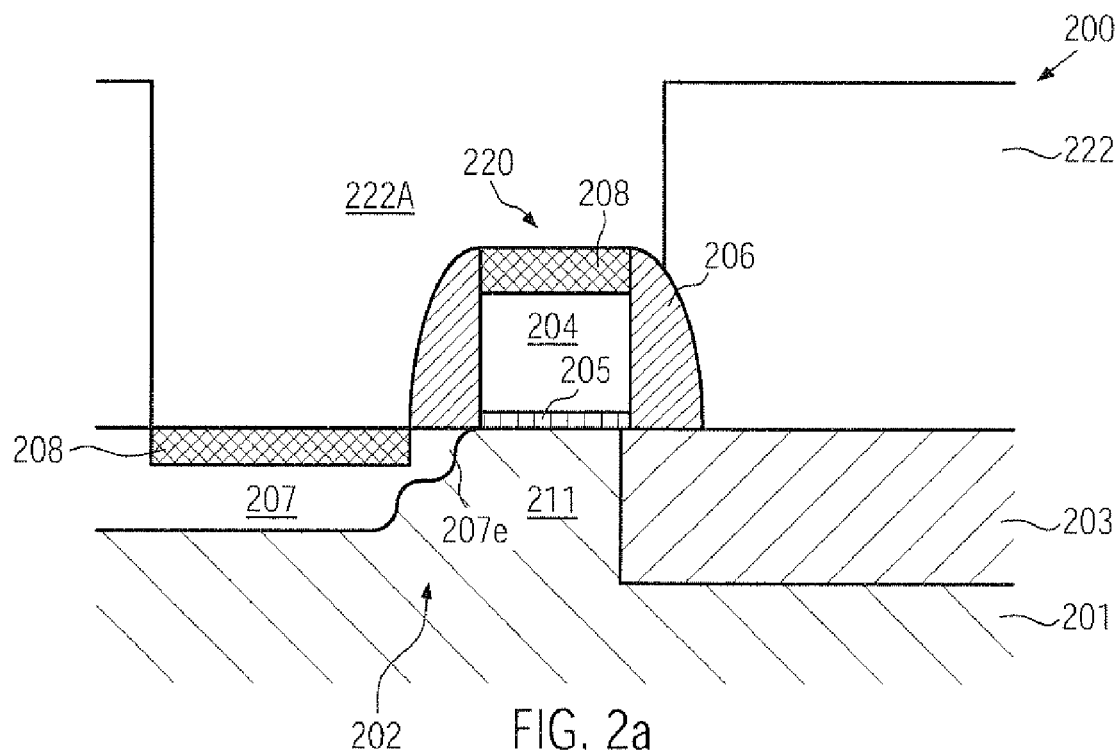
FIGS. 2a-2g schematically show cross-sectional views of a semiconductor device including a circuit element and a contact region for a direct connection of certain contact regions of the circuit element during various manufacturing stages in accordance with illustrative embodiments of the present invention, in which an additional etch stop layer is formed on the basis of an opening of a mask layer prior to the deposition of the interlayer dielectric material.

With reference to FIGS. 2a-5c, further illustrative embodiments of the present invention will now be described in more detail. FIG. 2a schematically shows a cross-sectional view of a semiconductor device 200 comprising a circuit element 220 which, in turn, may include a gate electrode or conductive line 204, which may comprise polysilicon, a metal silicide and the like, and a drain/source region or a portion of an active semiconductor region 207, which may be connected to a respective extension region 207e. The drain/source region 207 may be formed within an active area 211, which may be defined by an isolation structure 203 within a semiconductor layer 202. The semiconductor layer 202 may be formed in or above a substrate 201, which may represent any appropriate carrier for forming or receiving thereon the semiconductor layer 202. In illustrative embodiments of the present invention, the substrate 201 may represent a bulk silicon substrate or an SOI substrate having formed thereon a crystalline silicon-based layer, wherein it should be appreciated that a silicon-based layer may also include significant amounts of other materials, such as germanium, carbon or other semiconductor materials.

The gate electrode or conductive line 204 may be formed on an insulating layer 205, which electrically insulates the gate electrode 204 from the active area 211. Moreover, appropriate sidewall spacers 206, for instance comprised of silicon nitride, may be formed on sidewalls of the gate electrode 204, wherein it should be appreciated that two or more individual spacer elements may be included in the sidewall spacer 206. Moreover, respective metal silicide regions 208 may be provided in the gate electrode 204 and the drain/source region 207, when a silicon-based semiconductor is considered. Furthermore, a mask 222, for instance a resist mask, may comprise an opening 222A having dimensions that substantially correspond to the dimensions of a respective contact opening to be formed above the circuit element 220.

A typical process flow for forming the semiconductor device 200 as shown in FIG. 2a may comprise substantially the same processes as are previously explained with reference to the device 100 shown in FIG. 1a, wherein, however, a significant difference occurs after the formation of the metal silicide regions 208. In one illustrative embodiment, the mask 222 may be formed after any cleaning processes for removing any excess material and contaminations resulting from the preceding metal silicide formation, on the basis of a lithography mask that may correspond to a respective mask for the formation of a contact opening in an interlayer dielectric material, as will be described later on. Consequently, during the photolithography process for forming the mask 222, a respective aligning procedure is performed to position the opening 222A substantially above the circuit element 220, wherein an alignment accuracy may be on the same order of magnitude as will also be achieved during the subsequent aligning of the lithography mask when forming the actual contact opening. Consequently, the further lithography step for forming the mask 222 may not add any additional manufacturing tolerances.

Figure 2B:
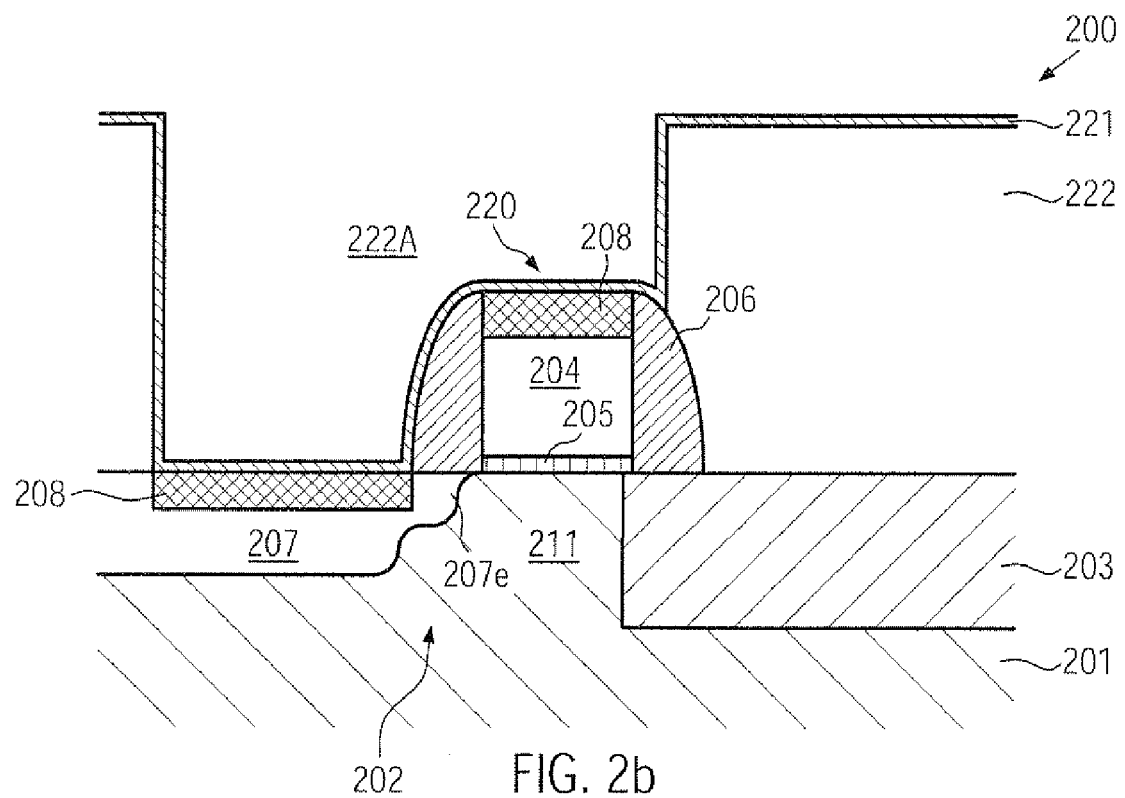

FIG. 2b schematically shows the semiconductor device 200 after the completion of the lithography step and the formation of the mask 222, which may be accomplished on the basis of well-established development recipes, when the mask 222 is comprised of a photoresist. Moreover, an etch stop layer 221 is formed on exposed portions of the circuit element 220 and the mask 222. In one illustrative embodiment, the etch stop layer 221 is comprised of a material that exhibits a high etch resistance with respect to an etch recipe designed for opening a contact etch stop layer in a subsequent etch process. For example, silicon nitride is frequently used as a material for a contact etch stop layer due to its superior etch selectivity with respect to silicon dioxide, which is a commonly used material for an interlayer dielectric, as is previously explained. Hence, the etch stop layer 221 may be comprised of any appropriate material that exhibits a high etch resistance with respect to the specific etch recipe used for etching through the contact etch stop layer. In one illustrative embodiment, the etch stop layer 221 may comprise a highly conductive material, such as titanium, tantalum, titanium nitride and the like, so that the etch stop layer 221 formed above the circuit element 220 may not have to be removed prior to the filling in of conductive material for actually forming a respective contact region. In still other illustrative embodiments, the etch stop layer 221 may be comprised of any appropriate dielectric material, such as silicon dioxide, silicon carbide, nitrogen-enriched silicon carbide and the like. For example, materials of the group $SiO_x$, $SiC$, $SiC_xO_y$, $SiC_xN_y$, may be efficiently used as etch stop layers having a high selectivity with respect to silicon nitride. The etch stop layer 221 may be formed on the basis of well-established deposition recipes, such as PECVD and the like, wherein a process temperature may be maintained below a critical temperature at which the mask may lose its mechanical stability. For example, a process temperature of approximately 400° C. and less may be efficiently used in combination with a resist mask layer. It should be appreciated that, in the embodiments illustrated in FIGS. 2a and 2b, the mask 222 is formed prior to the deposition of the etch stop layer 221, wherein a patterning of the etch stop layer 221 is accomplished by a subsequent removal of the mask 222, thereby also removing unwanted portions of the etch stop layer 221 formed on the mask layer 222.

In other illustrative embodiments, the etch stop layer 221 may be deposited prior to the formation of the mask layer 222 by any appropriate deposition technique, wherein a corresponding restriction with respect to process temperature may be circumvented. For example, a highly conductive material such as titanium may be deposited by sputter deposition techniques on the basis of process parameters selected in accordance with process requirements. Similarly, any appropriate dielectric material may be deposited having the required selectivity with respect to silicon nitride, wherein any requirements with respect to process temperature may not be relevant as long as a maximum temperature dictated by the stability of the metal silicide regions 208 may not be exceeded. Thereafter, the mask layer 222 may be formed on the basis of well-established lithography techniques wherein, contrary to the mask layer 222 as shown in FIGS. 2a and 2b, a negative photoresist may be used, thereby covering the circuit element 220 while exposing the remaining portions of the device 200. In this way, the same photolithography mask may be used as is also used for the mask layer 222, and thereafter, based on the negative resist mask, unwanted portions of the etch stop layer 221 may be removed followed by the removal of the corresponding etch mask formed above the circuit element 220.

Figure 2C:
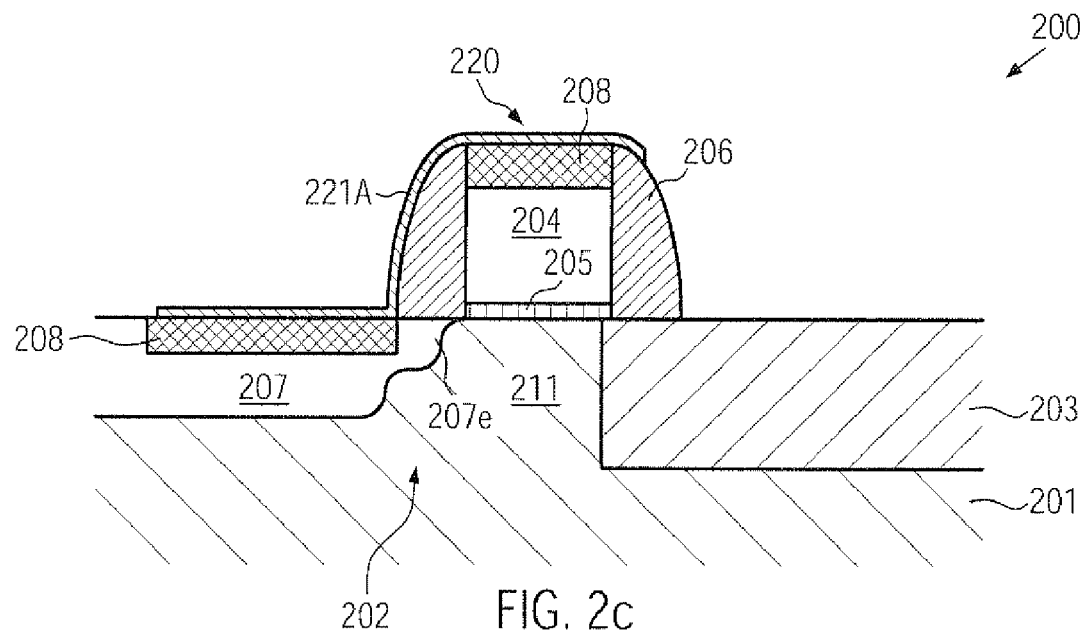

FIG. 2c schematically shows the semiconductor device 200 after the completion of the above-described process sequence for the mask layer 222 as shown in FIGS. 2a and 2b. Consequently, the device 200 comprises a portion of the etch stop layer 221, which is now referred to as 221A, covering a portion of the circuit element 220 corresponding to the mask 222. The mask 222 as shown in FIG. 2b may be removed on the basis of well-established lift-off techniques followed by any appropriate cleaning processes as are also well established in the art. Thereafter, further processing may be continued corresponding to the conventional techniques with the formation of an appropriate contact etch stop layer and the deposition of an appropriate dielectric interlayer material, as is for instance previously described with reference to FIG. 1a.

Figure 2D:
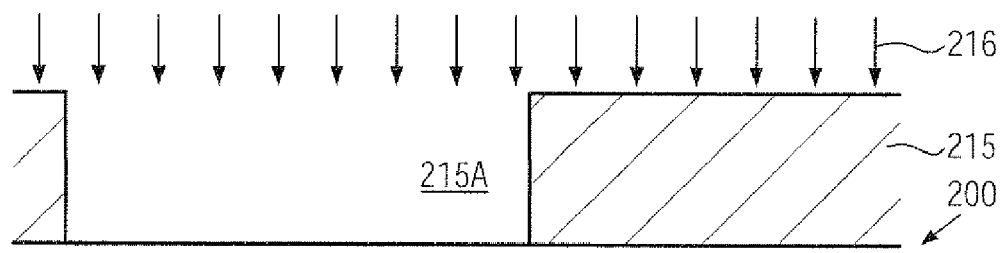
Figure 2D:
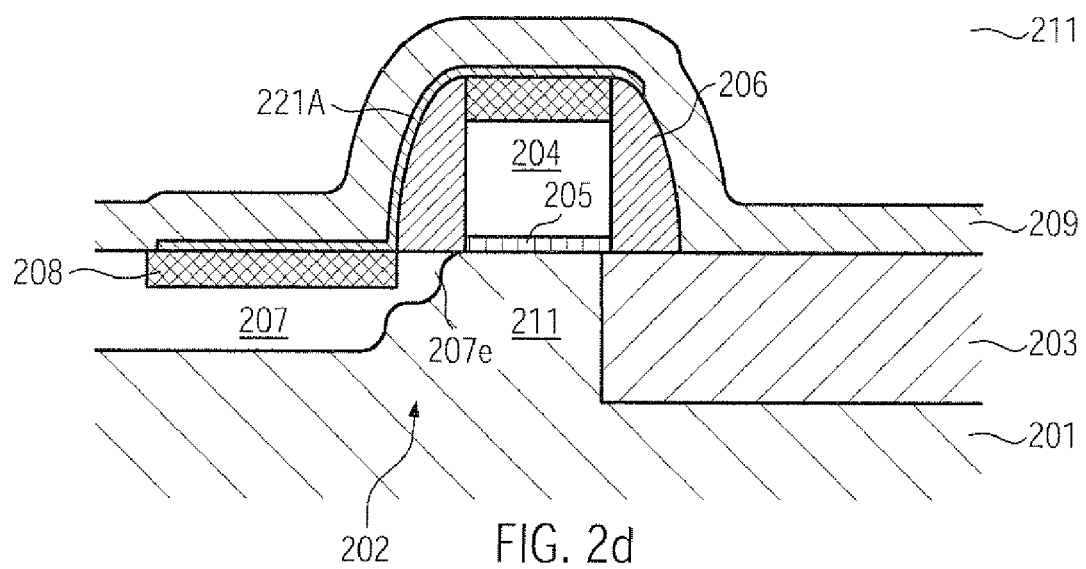

FIG. 2d schematically illustrates the semiconductor device 200 in a further advanced manufacturing stage. In this stage, a contact etch stop layer 209 is formed above the circuit element 220 and the etch stop layer 221A, followed by an interlayer dielectric material 211, wherein, in illustrative embodiments, the contact etch stop layer 209 and the interlayer dielectric material 211 may be comprised of silicon nitride and silicon dioxide, respectively. It should be appreciated, however, that the principles of the present invention are not restricted to silicon nitride and silicon dioxide as respective contact etch stop layer and interlayer dielectric materials, as long as the contact etch stop layer 209 provides a reliable stop of etch process 216 for etching through the interlayer dielectric material 211 on the basis of a respective resist mask 215 and the additional etch stop layer 221A provides a reliable control of a further etch process for opening the contact etch stop layer 209.

The resist mask 215 may be formed in accordance with well-established lithography techniques involving the alignment of the corresponding lithography mask to the underlying circuit element 220. As previously explained with reference to the mask 222, the same lithography mask may be used for forming the resist mask 215, wherein a certain degree of misalignment may be obtained during the formation of a respective opening 215A within the resist mask 215. It should be appreciated, however, that a corresponding slight misalignment may not adversely affect the efficiency of the etch stop layer 221A, since the purpose of the etch stop layer 221A is to efficiently protect the area around the sidewall spacer 206 and thus the area in the vicinity of the extension region 207e, which is reliably accomplished even for any tolerable misalignment during the lithography process for forming the resist mask 215. Based on the resist mask 215, the etch process 216 may be performed and may be reliably stopped within the contact etch stop layer 209. Subsequently, the contact etch stop layer 209 may be opened on the basis of well-established recipes, wherein sensitive portions of the circuit element 220, such as the sidewall spacers 206, are reliably covered by the etch stop layer 221A.

Figure 2E:
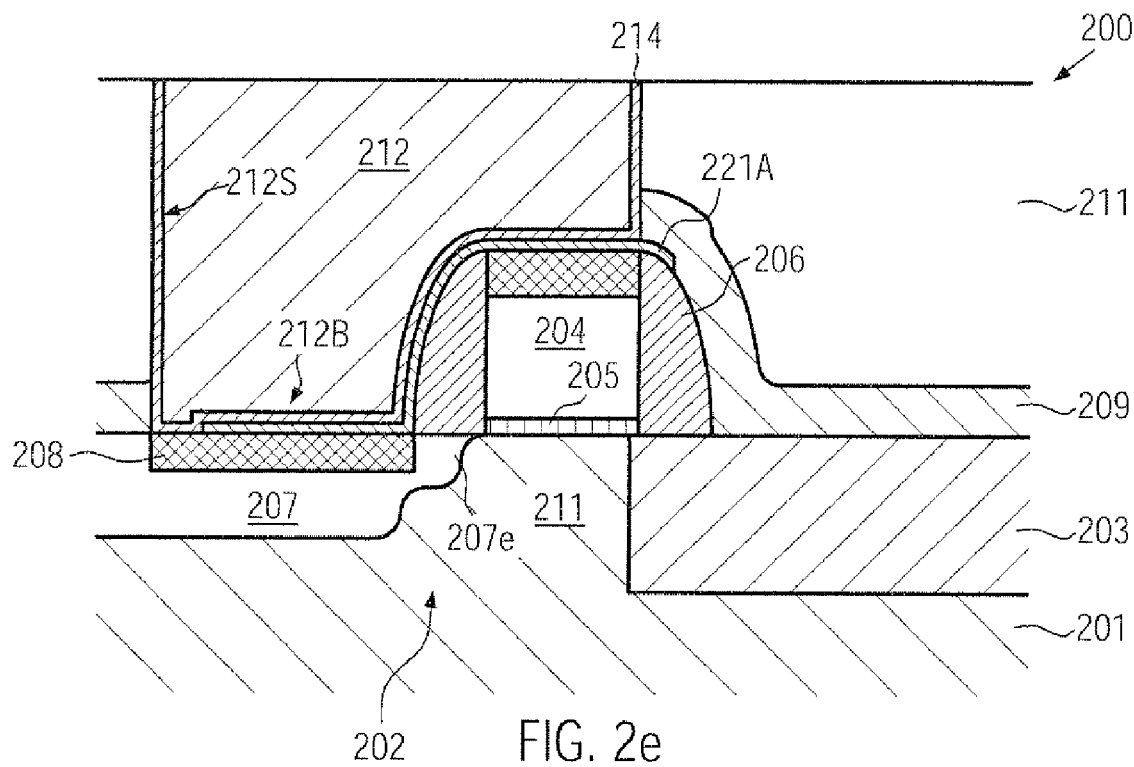

FIG. 2e schematically shows the semiconductor device 200 after the completion of the above-described etch process in a further advanced manufacturing stage, wherein it is referred to an embodiment in which the etch stop layer 221A is provided in the form of a conductive material, such as titanium. In this stage, the device 200 comprises a contact region 212 that is formed within the interlayer dielectric material and which is in electrical contact with the respective metal silicide regions 208 of the gate electrode 204 and the drain/source region 207. The contact region 212 may have formed therein a barrier layer 214, for instance comprised of titanium, titanium nitride and the like, so as to cover sidewall portions 212S as well as a bottom portion 212B, i.e., surface portions of the circuit element 220. Moreover, since the etch stop layer 221A is highly conductive, removing the same may not be necessary, thereby significantly reducing process complexity and also maintaining integrity of at least the metal silicide region 208 formed in the gate electrode 204. Consequently, a direct electric connection between the gate electrode 204 and the drain/source region 207 within the interlayer dielectric material 211 may be achieved, while significantly reducing the risk for any shortcuts or penetration of the extension region 207e by the contact region 212, as is the case in the conventional technique previously described. Moreover, due to the provision of a conductive etch stop layer, which may not be removed prior to the deposition of a barrier material and a conductive material for filling the respective contact opening, a high degree of process flexibility is achieved.

Figure 2G:
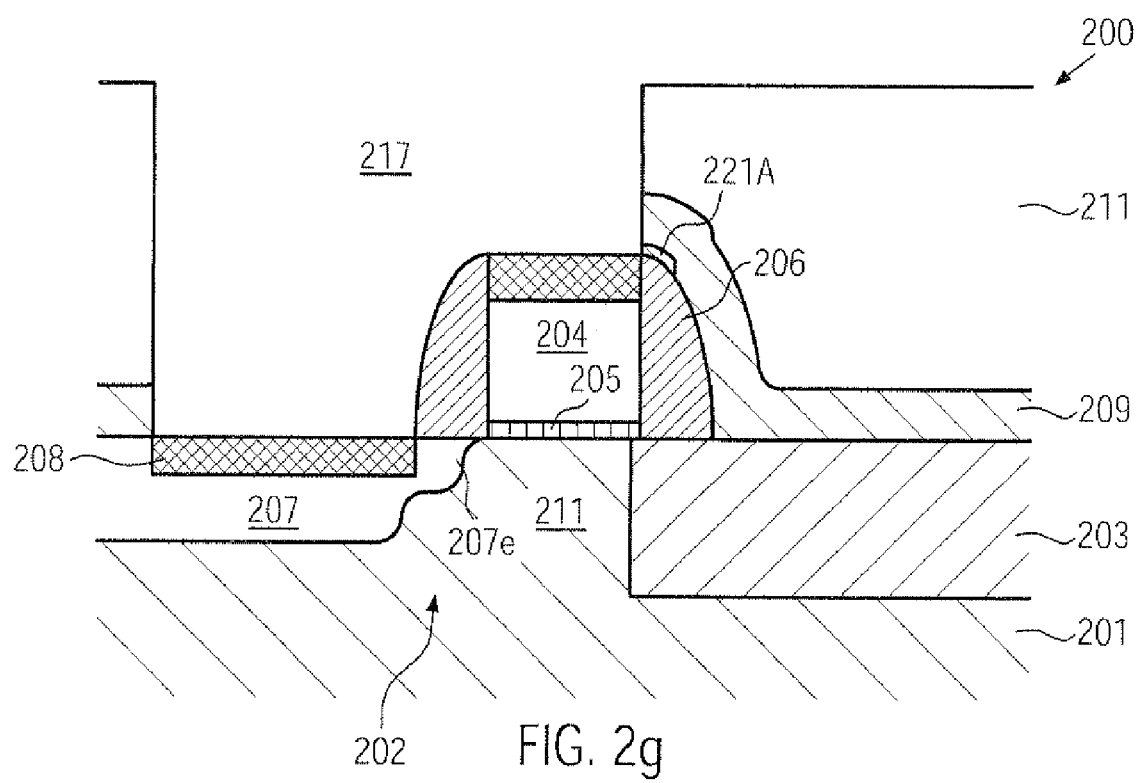
Figure 2F:
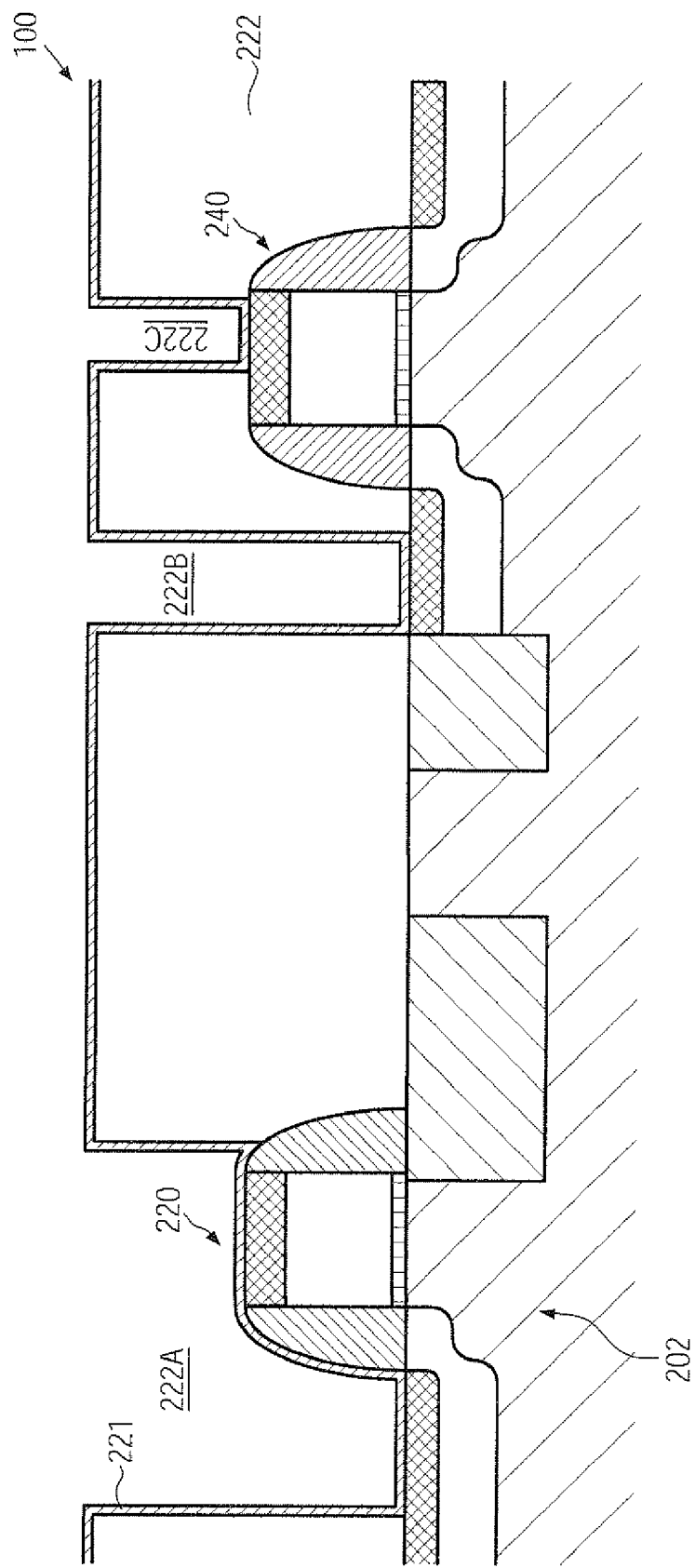

FIG. 2f schematically shows the semiconductor device 200 in accordance with further illustrative embodiments in which, in addition to the circuit element 220, a further circuit element, for instance in the form of a field effect transistor 240, is provided, wherein the mask 222 is formed on the basis of a standard contact lithography mask so as to also define respective openings 222B and 222C for the circuit element 240 on the basis of a standard contact technology. Consequently, the conductive material of the etch stop layer 221 is also formed within the respective openings 222B and 222C, thereby providing the conductive etch stop layer 221 also at portions of the circuit element 240, at which actual contact openings are to be subsequently formed. Consequently, during the subsequent filling in of barrier material, such as the barrier layer 214 and the actual contact material, such as tungsten and the like, as is shown in FIG. 2e, the respective process sequence may be selected to enhance the performance of the resulting contact rather than selecting the process parameters of the deposition process on the basis of deposition requirements, such as coverage by the barrier material and the like. For example, a highly efficient back sputter technique may be used due to the presence of the conductive material provided by the etch stop layer 221, thereby significantly relaxing the constraints for lower sidewall coverage during a subsequent sputter deposition process for forming the actual barrier layer in the respective contact openings.

FIG. 2g schematically illustrates the semiconductor device 200 according to the device as shown in FIG. 2b, wherein the etch stop layer 221 may be provided in the form of a dielectric material that may have to be removed prior to the actual fill process for forming the contact region 212. Thus, in FIG. 2g, the device comprises a respective contact opening 217, wherein portions of the etch stop layer 221A exposed by the contact opening 217 have been removed on the basis of an appropriate etch technique. For instance, the etch stop layer 221A may be formed of any appropriate material, such as silicon dioxide, which may be efficiently removed on the basis of highly selective wet chemical etch processes without significantly affecting other device areas. Thereafter, the barrier layer 214 may be deposited and subsequently an appropriate material, such as tungsten, may be filled in, thereby completing the contact region 212.

Figure 3A:
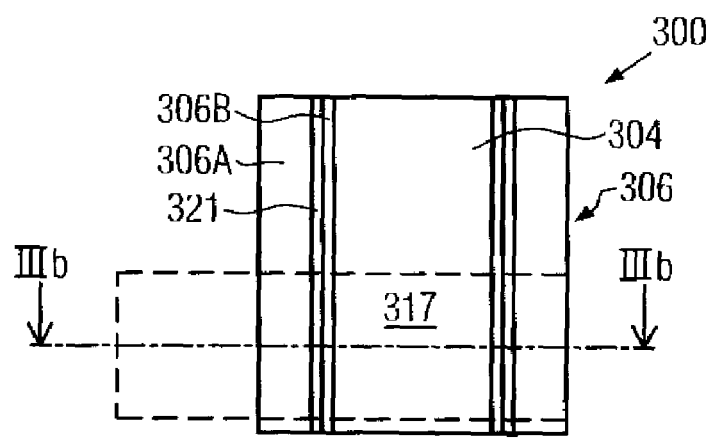
FIGS. 3a-3b schematically show a top view and a cross-sectional view, respectively, of a semiconductor device having an increased thickness of an etch stop layer located between an active semiconductor region and a corresponding sidewall spacer element in accordance with still further illustrative embodiments.
Figure 3B:
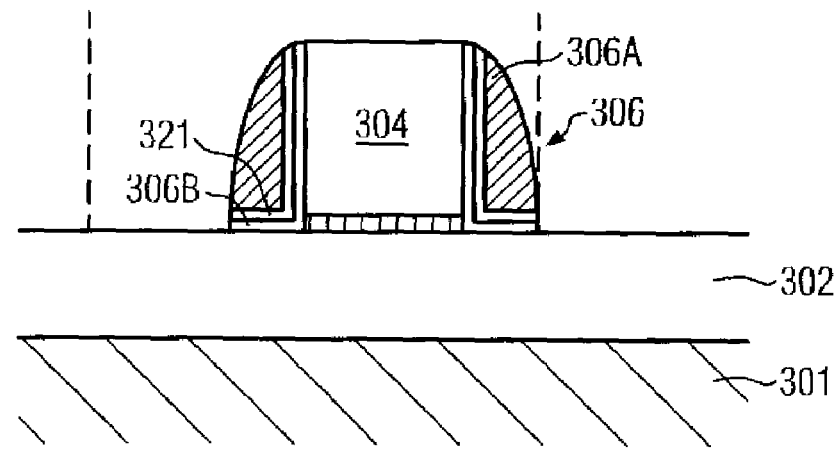
Figure 3C:
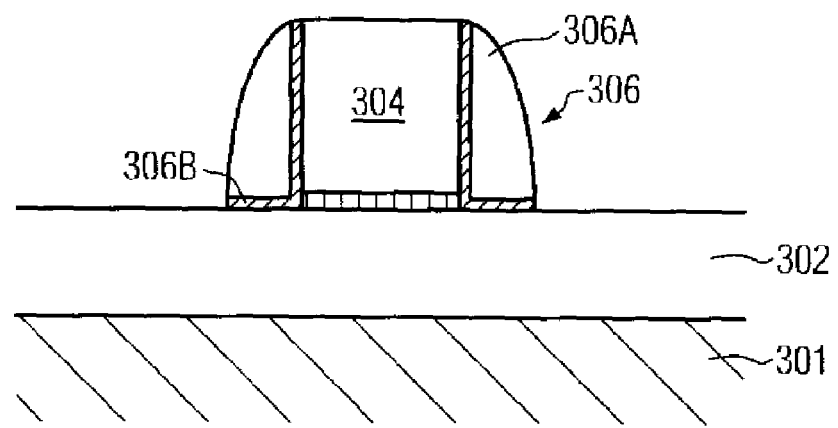
FIG. 3c schematically illustrates a sidewall spacer structure with increased etch selectivity for a contact etch process according to one illustrative embodiment.

With reference to FIGS. 3a-3c, further illustrative embodiments of the present invention will now be described in more detail, in which the selectivity of the sidewall spacer structure itself may be increased with respect to an overlying contact etch stop layer to reduce an unwanted etch penetration into a respective silicon area in the active region.

FIG. 3a schematically shows a top view of a semiconductor device 300 including a gate electrode or conductive line 304 having formed on sidewalls thereof a respective sidewall spacer structure 306. Moreover, an area 317, indicated with dashed lines, in which a contact region is to be formed to directly connect the conductive line 304 with an active region such as a drain/source region adjacent to the conductive line 304 and the spacer structure 306.

FIG. 3b schematically illustrates a cross-sectional view along the line IIIb of FIG. 3a. Hence, the semiconductor device 300 comprises the gate electrode 304 formed above a silicon-based semiconductor layer 302, which is provided on an appropriate substrate 301. Moreover, the sidewall spacer structure 306 is formed at sidewalls of the gate electrode 304, wherein, in one illustrative embodiment, the structure 306 may comprise spacer elements 306A, which may be comprised of silicon nitride and a respective silicon dioxide liner 306B. Furthermore, the sidewall spacer structure 306 may comprise, at least within the region 317 (FIG. 3a), an additional etch stop layer 321, for instance comprised of silicon dioxide or any other appropriate material having a high etch selectivity with respect to silicon nitride, to provide additional process safety margins with respect to a corresponding process, as is also described with reference to FIG. 2c. The etch stop layer 321 may be formed prior to the formation of the spacers 306A by depositing an appropriate material, wherein any excess material may be removed on the basis of a corresponding resist mask, as is also described with reference to FIGS. 2a and 2b when referring to a negative resist mask. For example, after the deposition of an appropriate material, a corresponding lithography process may be performed on the basis of a negative resist, thereby covering the area 317 (FIG. 3a) while exposing the remaining surface portions. Subsequently, the exposed portion of the etch stop layer 321 may be removed, while maintaining the layer 321 within the area 317. Thereafter, the spacers 306A may be formed in accordance with well-established recipes while any exposed portions of the etch stop layer 321, for instance on top of the gate electrode 304, and of the liner 306B may be subsequently removed selectively to the spacers 306A. It should be appreciated that any other etch regime, for instance depositing the etch stop layer 321 and subsequently forming the spacers 306A with a subsequent removal of any unwanted material of the etch stop layer 321A, may also be applied. Furthermore, a similar technique as previously described with reference to FIGS. 2a and 2b may also be applied. In a further illustrative embodiment, first a resist mask may be formed to expose the area 317 and subsequently an appropriate material may be deposited within the area 317. After the removal of the resist mask including any unwanted portion of the etch stop layer 321, the further processing may be continued by forming the spacers 306A on the basis of well-established recipes. Consequently, due to the provision of the additional etch stop layer 321, an etch process for opening a respective contact etch stop layer, which may also result in a removal of the sidewall spacers 306A, may be reliably stopped within the etch stop layer 321, possibly in combination with the remaining liner 306B.

FIG. 3c illustrates the device 300 according to still other illustrative embodiments, in which the etch selectivity of the sidewall spacer structure 306 with respect to a silicon nitride contact etch stop layer may also be significantly enhanced by providing the structure 306 such that the spacer elements 306A may be comprised of a material, such as silicon dioxide, silicon carbide or any other appropriate material as explained above, so that the spacers 306A per se may not be etched during the subsequent process for opening the respective contact etch stop layer. In order to maintain a high degree of compatibility with conventional spacer techniques, the liner 306B may be formed from a material having a high etch selectivity with respect to the spacer 306A, for instance the liner 306B may be formed of silicon carbide or any other appropriate material, which may also exhibit a high etch selectivity with respect to silicon nitride. In this way, a high etch selectivity is obtained for both the liner 306B and the spacer 306A, thereby substantially avoiding the risk for etching into lower-lying silicon regions covered by the spacers 306A.

With reference to FIGS. 4a-4g, further illustrative embodiments of the present invention will be described in which, additionally or alternatively, sidewall portions of respective polysilicon lines or gate electrodes may be effectively protected during the formation of contact openings for directly connecting respective device areas within an interlayer dielectric material.

Figure 4A:
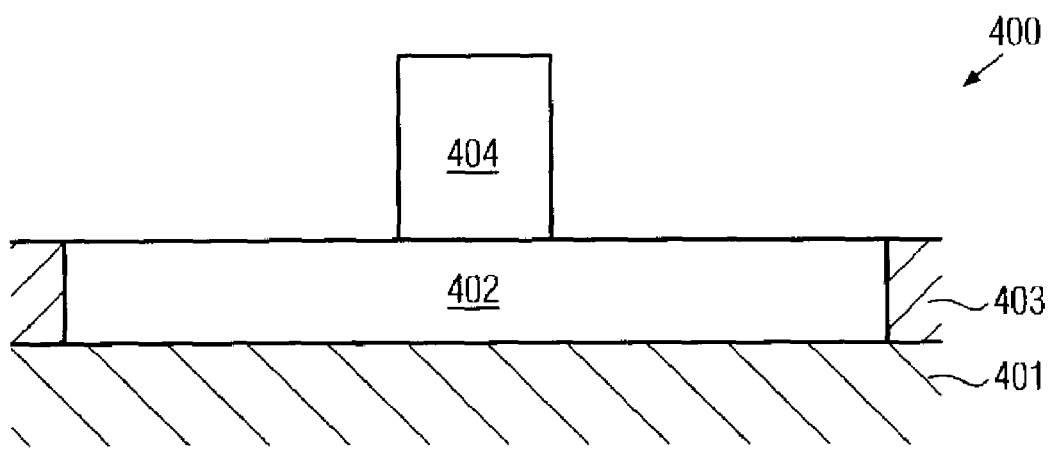
FIGS. 4a-4g schematically show cross-sectional views of a semiconductor device during the formation of an etch protection layer covering sidewall portions of a conductive line during the formation of a contact region in accordance with still other illustrative embodiments of the present invention.

In FIG. 4a, a semiconductor device 400 comprises a substrate 401 above which is formed a semiconductor layer 402. A respective active area is defined in the semiconductor layer 402 by means of isolation trenches 403. Above the semiconductor layer 402 is formed a conductive line structure 404, such as a polysilicon line structure, which may represent a gate electrode structure or any appropriate conductive line structure. It should be appreciated that the components of the device 400 may have substantially the same configuration as is previously described with reference to the devices 100, 200 and 300. As previously described with reference to FIGS. 1c and 1d, especially sidewall portions of the conductive line structure 404 may be significantly eroded during a corresponding etch process, thereby resulting in a reduced mechanical stability and thus reliability of a corresponding gate electrode structure.

Figure 4B:
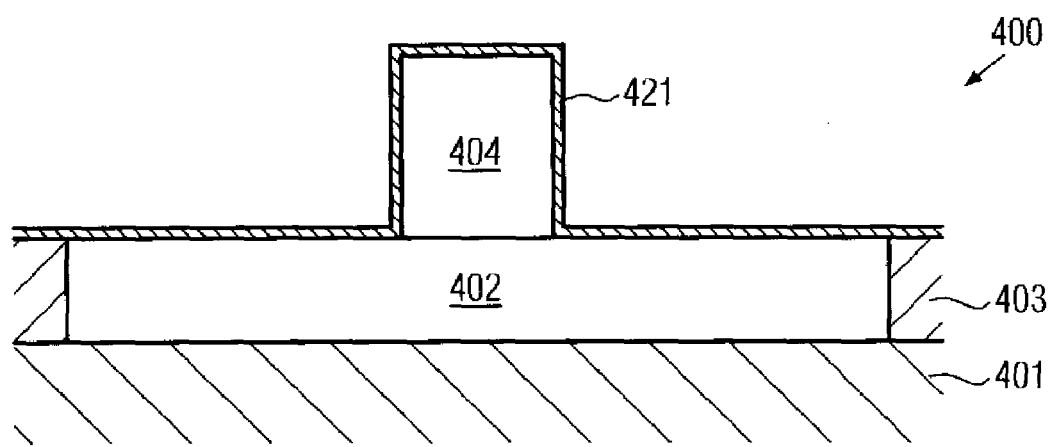

FIG. 4b schematically shows the semiconductor device 400 with an etch protection layer 421 formed above the semiconductor layer 402 and the conductive line structure 404, wherein sidewall portions thereof, in particular, are reliably covered by the etch protection layer 421. In some embodiments, the layer 421 may extend the entire extension of the conductive line 404, while, in other embodiments, the layer 421 may be patterned so as to only be formed in the area corresponding to a contact area still to be formed. For example, the etch protection layer 421 may be comprised of any appropriate material, such as any of the dielectric materials specified above, which exhibit a high etch selectivity with respect to silicon nitride. In one illustrative embodiment, the etch protection layer 421 may be comprised of silicon carbide or nitrogen-enriched silicon carbide, which may also exhibit a high etch selectivity with respect to silicon dioxide, so that conventional spacer technology may also be used during the further formation of conventional silicon nitride-based sidewall spacers. In one illustrative embodiment, a thickness of the etch protection layer 421 may range from approximately 5-20 nm.

Figure 4C:
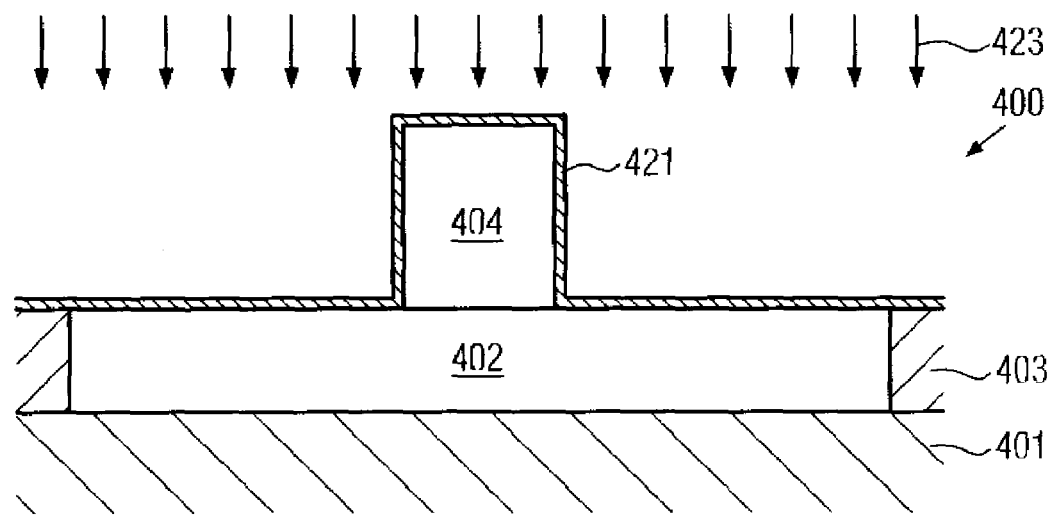

FIG. 4c schematically shows the semiconductor device 400 during an anisotropic etch process 423 for removing unwanted portions of the etch protection layer 421, i.e., for removing the etch protection layer 421 from horizontal surface portions of the device 400. For example, a variety of appropriate anisotropic etch techniques are available for a plurality of dielectric materials including the above-specified dielectrics.

Figure 4D:
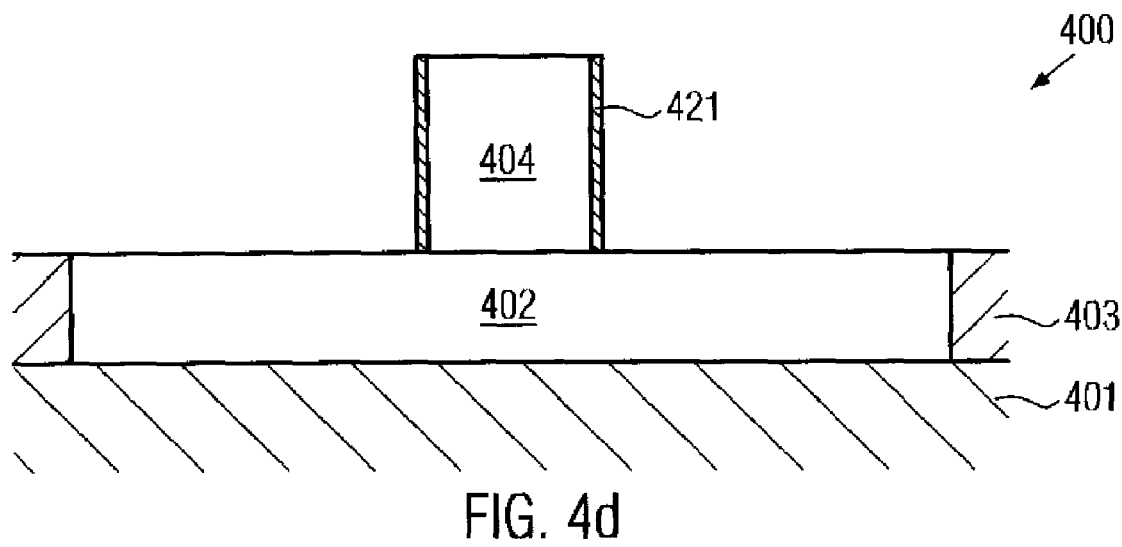

FIG. 4d schematically shows the semiconductor device 400 after the completion of the etch process 423, thereby providing an etch protection layer, now referred to as 421A, at sidewall portions of the conductive line structure 404. Thereafter, further processing may be continued on the basis of well-established recipes or any of the embodiments described above may also be used in combination with the method for forming the semiconductor device 400. Thus, the manufacturing process may be continued on the basis of the device 400 as shown in FIG. 4d on the basis of any of the processes as described with reference to FIGS. 1a-1b, 2a-2f and 3a-3c.

Figure 1C:
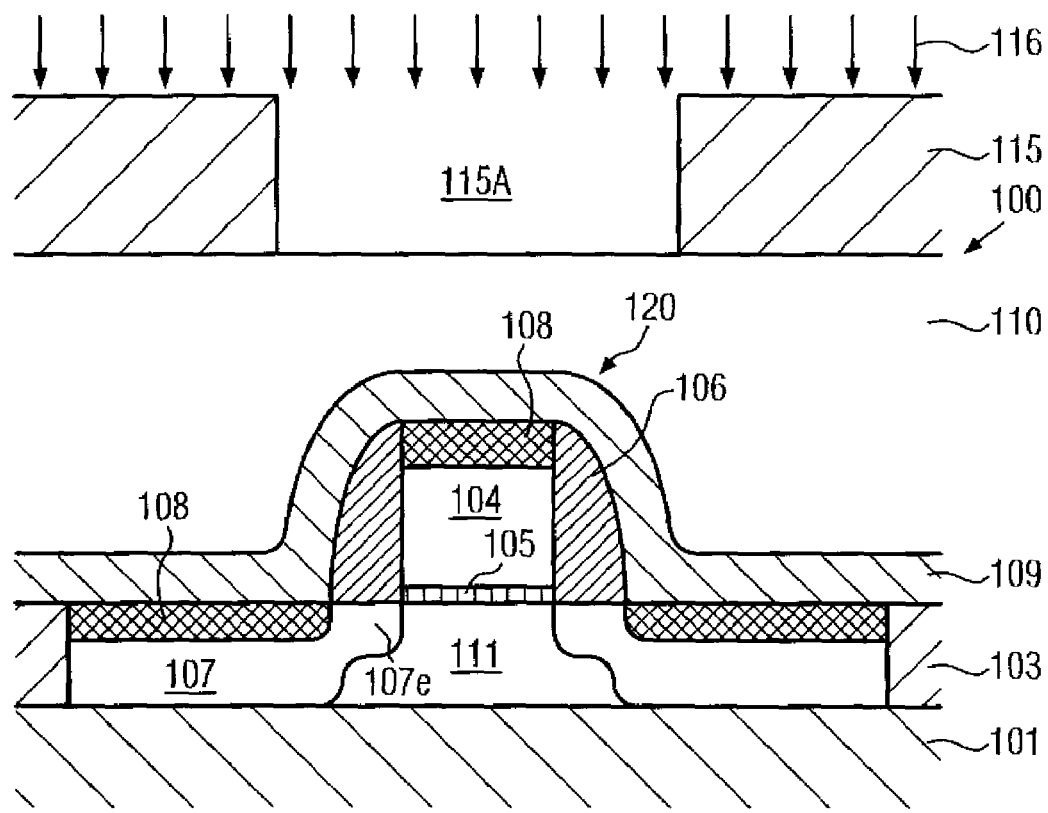
Figure 1D:
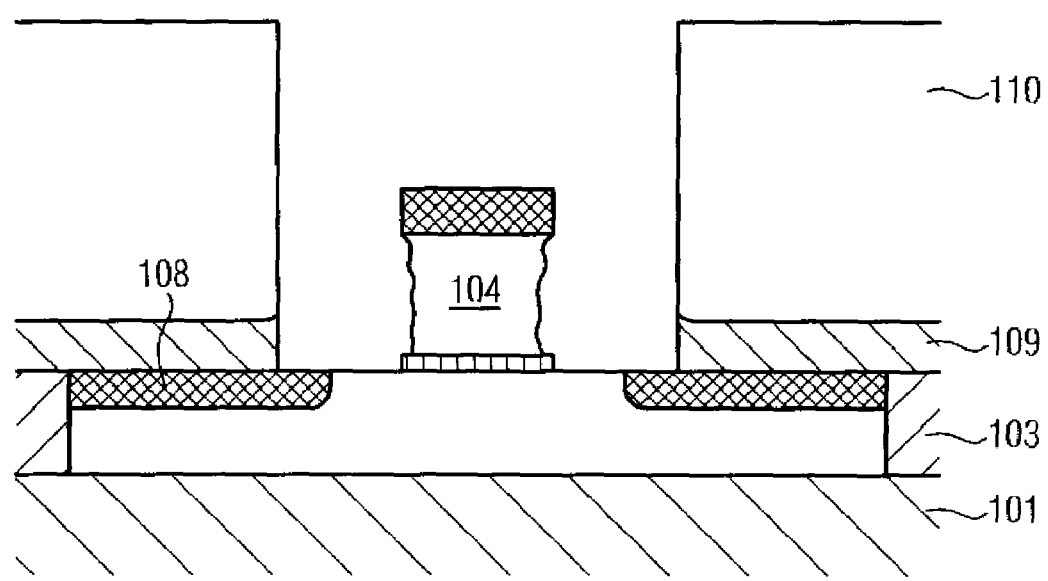
Figure 4E:
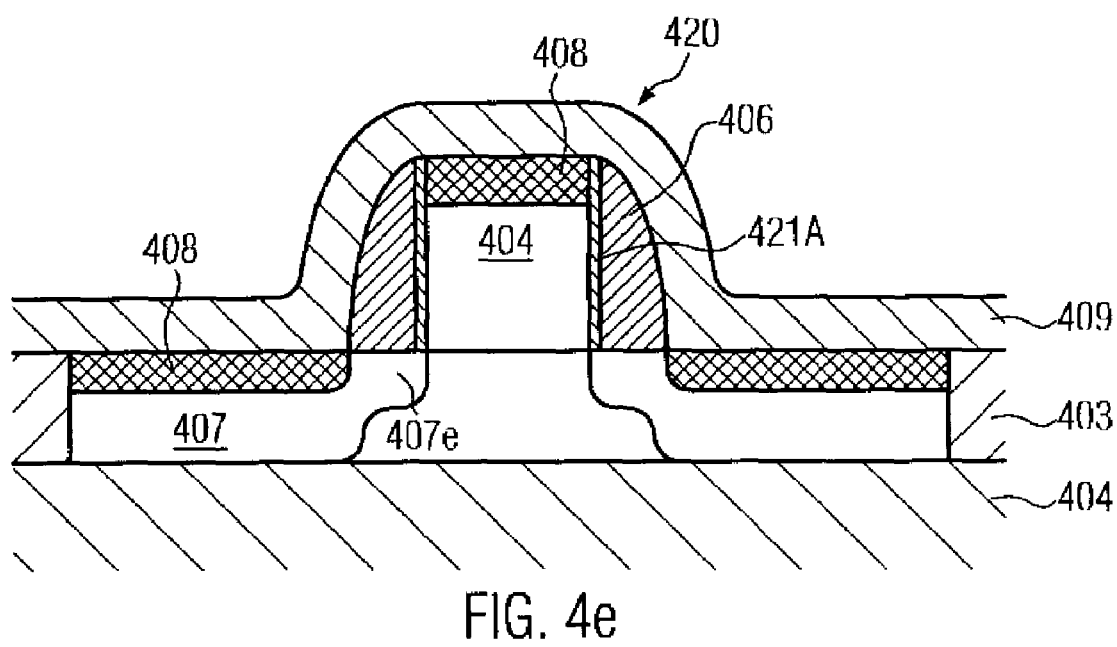

FIG. 4e schematically shows the semiconductor device 400 in a further advanced manufacturing stage, in which a conventional process technique as is for instance described with reference to FIG. 1a is used. Hence, the semiconductor device 400 may comprise drain/source regions 407 including appropriate extension regions 407e formed within the semiconductor layer 402. Moreover, an appropriate spacer structure 406 may be formed adjacent to the etch protection layer 421A and respective metal silicide regions 408 may be formed in the conductive line structure 404 and within the drain/source regions 407. Moreover, a contact etch stop layer 409 may be formed above the circuit element 420.

Figure 4F:
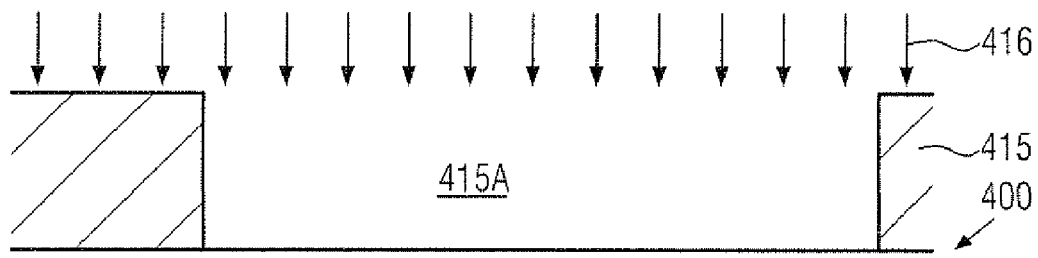
Figure 4F:
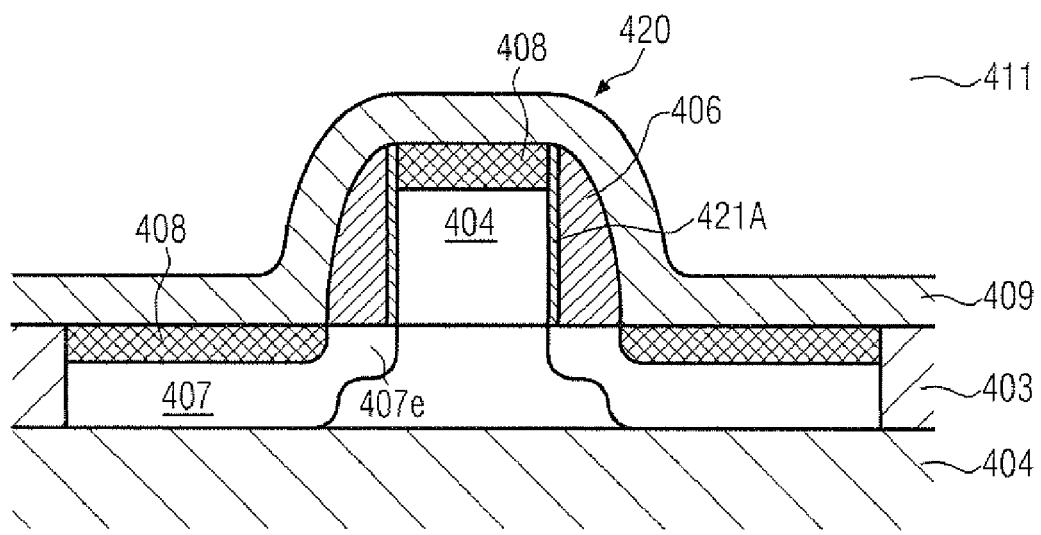

FIG. 4f schematically illustrates the semiconductor device 400 in a further advanced manufacturing stage, in which a resist mask 415 is formed above a dielectric interlayer material 411, wherein the device 400 is subjected to an anisotropic etch process 416 to form a respective contact opening according to a respective resist opening 415A. It should again be appreciated that the device as shown in FIG. 4f may be formed in accordance with any desired process technique as previously described. During the etch process 416 and the subsequent opening of the contact etch stop layer 409, the conductive line structure 404 is reliably protected by the etch protection layer 421A, thereby substantially avoiding or reducing any material erosion, as may be the case in conventional techniques.

Figure 4G:
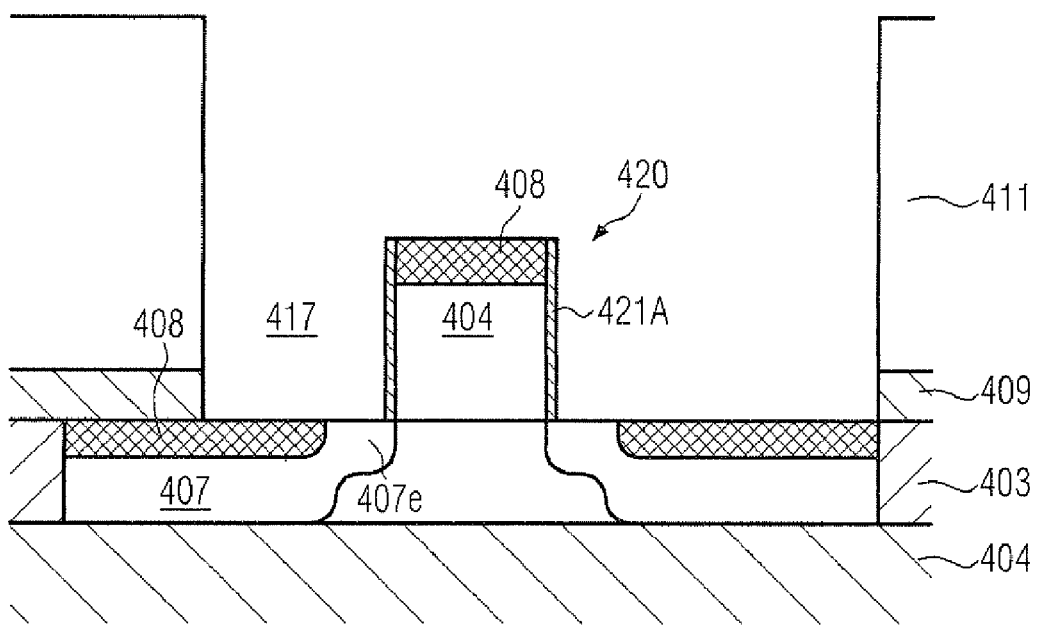

FIG. 4g schematically illustrates the semiconductor device 400 with a respective contact opening 417 formed around the conductive line structure 404, wherein the etch protection layer 421A is still in place. Consequently, a high degree of mechanical stability and integrity of the conductive line structure 404 may be achieved, wherein it should be appreciated that, in addition to the configuration as shown in FIG. 4g, any appropriate etch stop layer, such as the layers 221A or 321, may be provided so as to also reliably suppress any etching into the silicon areas of drain/source regions 407 and the extension regions 407e.

Figure 5A:
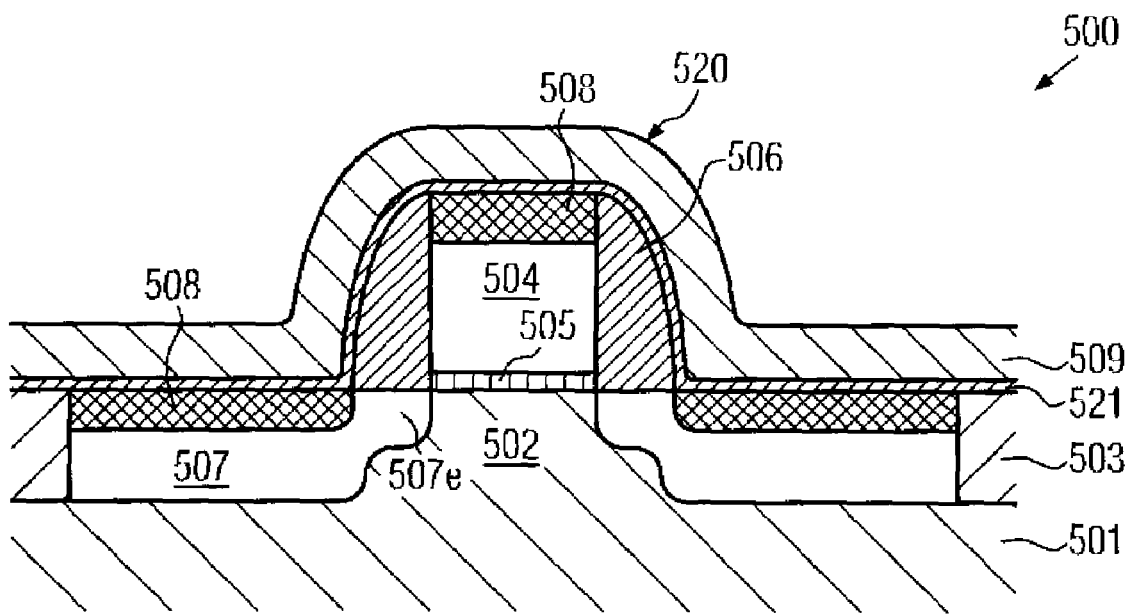
FIGS. 5a-5c schematically illustrate cross-sectional views of a semiconductor device during the formation of a contact region during various manufacturing stages in which an additional etch stop layer is provided to reliably stop the etch process through a contact etch stop layer in accordance with further illustrative embodiments of the present invention.
Figure 5B:
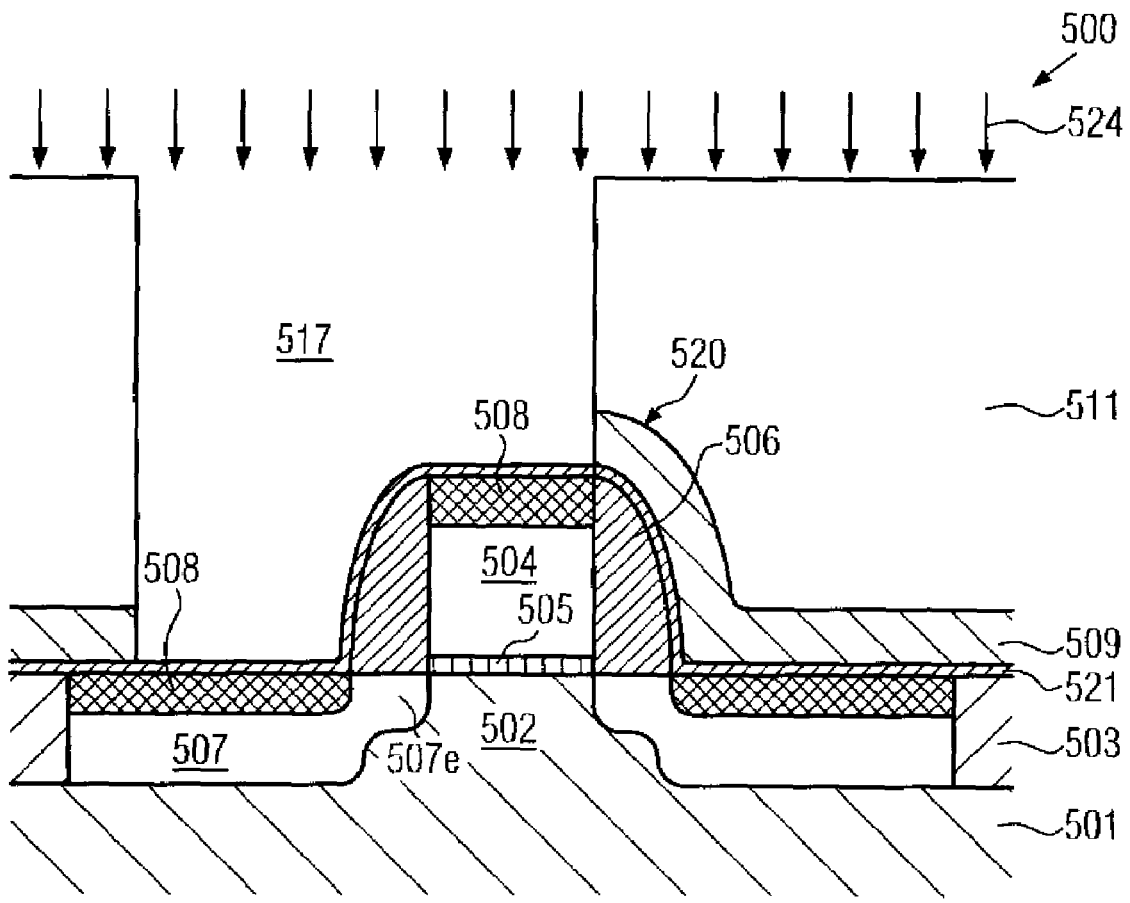
Figure 5C:
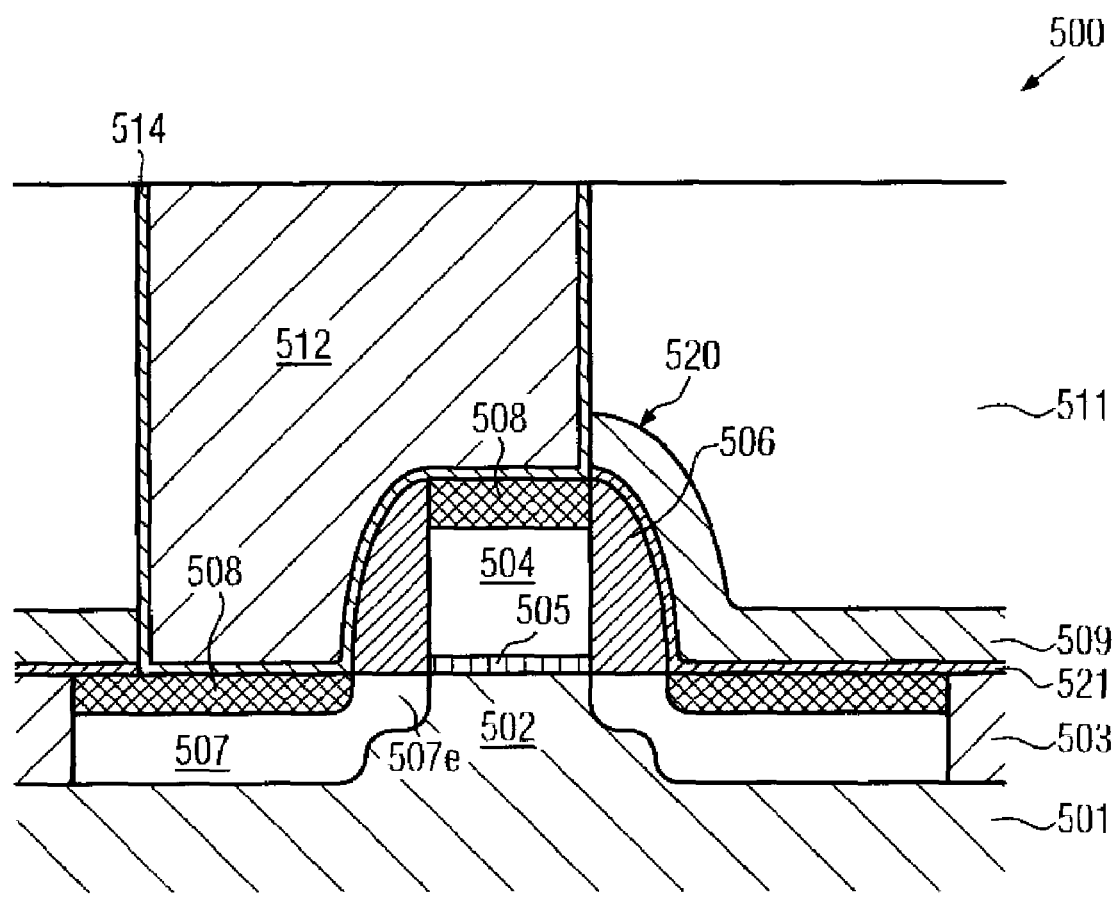

With reference to FIGS. 5a-5c, further illustrative embodiments of the present invention will now be described in more detail, wherein an etch stop layer may be formed immediately below the contact etch stop layer to reliably control an etch process for etching through the contact etch stop layer.

In FIG. 5a, a semiconductor device 500 comprises a substrate 501 having formed thereabove a semiconductor layer 502 in and on which is formed a circuit element 520. The circuit element 520 may comprise a gate electrode or conductive line 504, which is separated from the semiconductor layer 502 by an insulating layer 505. Moreover, respective spacers 506 may be formed at the sidewalls of the gate electrode 504. Active regions or drain/source regions 507 including respective extension regions 507e may be formed within the semiconductor layer 502. Finally, the circuit element 520 may have formed in the drain/source regions 507 and the gate electrode 504 metal silicide regions 508. Contrary to conventional devices, an etch stop layer 521 may be formed above the circuit element 520, followed by a contact etch stop layer 509. In one embodiment, the etch stop layer 521 may be formed along the entire extension of the conductive line or gate electrode 504, while in other embodiments the layer 521 may be formed in an area in which a contact opening is formed including any process tolerances regarding the alignment procedure for forming the respective contact opening. Hereby, the etch stop layer 521 may be formed of any appropriate material having a high etch selectivity with respect to the contact etch stop layer 509, which may be comprised of silicon nitride. Consequently, any appropriate dielectric material as is specified above may be efficiently used for the etch stop layer 521 to provide the desired selectivity. In one illustrative embodiment, the etch stop layer 521 may be comprised of silicon carbide or nitrogen-enriched silicon carbide, which may exhibit, in addition to a high etch selectivity with respect to silicon nitride, a moderately low permittivity, thereby reducing any undue parasitic capacitances.

The semiconductor device 500 as shown in FIG. 5a may be formed in accordance with well-established recipes, wherein, however, an additional deposition step may be performed to form the etch stop layer 521. It should be appreciated that, in some illustrative embodiments, the manufacturing sequence for the device 500 may also be combined with a respective manufacturing sequence as is described with reference to the device 400 so as to additionally form a respective etch protection layer at sidewalls of the gate electrode 504. After the formation of the etch stop layer 521 on the basis of well-established deposition recipes, the contact etch stop layer 509 may be formed on the basis of well-established recipes. Thereafter, a dielectric interlayer material may be deposited, for instance in the form of silicon dioxide, followed by any appropriate planarization technique. Next, a respective resist mask may be formed and an etch sequence may be carried out to transfer a respective contact opening from the resist mask into the dielectric interlayer material and into the lower-lying contact etch stop layer 509.

FIG. 5b schematically illustrates the semiconductor device 500 after the completion of the above-described process sequence. Consequently, the device 500 comprises a contact opening 517 within an interlayer dielectric material 511, wherein the contact etch stop layer 509 is also already opened. Due to the high etch selectivity of the etch stop layer 521 with respect to the contact etch stop layer 509, the circuit element 520 is reliably protected during the respective etch process. Subsequently, the device 500 is subjected to a further etch process 524 for removing an exposed portion of the etch stop layer 521. For this purpose, any well-established wet chemical etch recipes or dry etch processes may be performed, depending on the material comprising the etch stop layer 521. For example, for silicon carbide, well-established plasma-based etch processes are available in the art. After the removal of the exposed portion of the etch stop layer 521 and any optional cleaning processes, the further processing may be continued on the basis of a well-established process including the deposition of a barrier material and the filling in of a contact metal.

FIG. 5c schematically shows the semiconductor device 500 with a contact region 512 comprising a barrier layer 514 and an appropriate metal, such as tungsten. Consequently, due to the provision of the etch stop layer 521, a direct electrical connection from the gate electrode 504 to the drain/source region 507 may be established substantially without a risk of forming electrical shortcuts or creating any electrical paths for increased leakage currents.

As a result, the present invention provides an enhanced technique which enables the formation of contact regions, such as so-called CAREC contacts, which provide direct electrical connection of contact regions of circuit elements within an interlayer dielectric material without contact to the first metallization layer. Due to the provision of additional etch stop layers and/or etch protection layers, the mechanical integrity of respective polysilicon lines and gate electrodes may be significantly enhanced while additionally or alternatively the probability for forming leakage current paths or electrical shortcuts in active semiconductor regions may be significantly reduced. According to the present invention, efficient etch stop layers may be located below and/or above respective sidewall spacers so as to increase the reliability with which a corresponding etch process for forming contact openings for direct interconnections may be stopped prior to exposing any sensitive silicon areas, such as drain/source regions or extension regions or sidewalls of polysilicon lines.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an etch stop layer above a circuit element having a conductive line and an active semiconductor region, said etch stop layer covering an area that substantially corresponds to a contact opening to be formed to connect said conductive line and said active semiconductor region, wherein forming said etch stop layer comprises forming a mask layer for defining an opening above said circuit element, said opening having dimensions substantially corresponding to said contact opening, forming said etch stop layer in said opening and on said mask layer, and removing said mask layer;
   forming an interlayer dielectric material above said circuit element and said etch stop layer;
   forming said contact opening in said interlayer dielectric material by an etch process using said etch stop layer as an etch stop; and
   filling said contact opening with a conductive material.

2. The method of claim 1, wherein forming said etch stop layer comprises depositing a dielectric material above said circuit element prior to depositing said interlayer dielectric material, said dielectric material of said etch stop layer having a high etch selectivity to at least a lower portion of said interlayer dielectric material.

3. The method of claim 2, wherein depositing said interlayer dielectric material comprises depositing a contact etch stop layer on said etch stop layer and depositing an interlayer dielectric layer on said contact etch stop layer.

4. The method of claim 3, wherein forming said contact opening comprises etching said interlayer dielectric layer using said contact etch stop layer as an upper etch stop, etching through said contact etch stop layer using said etch stop layer as said etch stop.

5. The method of claim 1, wherein said mask layer is comprised of photoresist.

6. The method of claim 1, wherein forming said etch stop layer comprises depositing a conductive etch stop material.

7. The method of claim 1, wherein forming said etch stop layer comprises depositing an insulating material and removing said insulating material prior to filling said contact opening with said conductive material.

8. The method of claim 7, further comprising forming at least one standard contact opening in said interlayer dielectric material together with said contact opening in a common process sequence.

9. The method of claim 1, further comprising forming at least one sidewall spacer adjacent to said conductive line and using said at least one sidewall spacer to form said active semiconductor region by ion implantation prior to depositing said etch stop material.

10. The method of claim 1, further comprising:
    forming an etch protection layer on sidewalls of said conductive line wherein said etch protection layer protects the sidewalls of said conductive line during the forming of said contact opening.

11. The method of claim 10, wherein said etch stop layer is formed after forming said etch protection layer.

12. The method of claim 11, wherein said etch stop layer is comprised of a conductive material.

* * * * *